(12) United States Patent
Chang et al.

(10) Patent No.: US 6,474,407 B1
(45) Date of Patent: Nov. 5, 2002

(54) COMPOSITE HEAT SINK WITH HIGH DENSITY FINS AND ASSEMBLING METHOD FOR THE SAME

(75) Inventors: Yung-Cheng Chang, Taoyuan Shien (TW); Jui-Yuan Hsu, Taoyuan Shien (TW); Chen-Yu Yu, Taoyuan Shien (TW)

(73) Assignee: Delta Electronics Inc. (TW)

( * ) Notice: Subject to any disclaimer, the term of this patent is extended or adjusted under 35 U.S.C. 154(b) by 0 days.

(21) Appl. No.: 10/021,695

(22) Filed: Dec. 12, 2001

(51) Int. Cl.[7] .................................................. H05K 7/20
(52) U.S. Cl. ........................ 165/80.3; 165/185; 361/704
(58) Field of Search ................................ 165/80.3, 185; 361/697, 704, 710; 257/719, 722

(56) References Cited

U.S. PATENT DOCUMENTS

| | | | | |
|---|---|---|---|---|
| 5,558,155 A | * | 9/1996 | Ito | ............................... 165/185 |
| 5,761,811 A | * | 6/1998 | Ito | ......................... 29/890.039 |
| 6,104,609 A | * | 8/2000 | Chen | ......................... 165/80.3 |
| 6,340,056 B1 | * | 1/2002 | Huang et al. | ............... 165/185 |

* cited by examiner

Primary Examiner—Allen Flanigan
(74) Attorney, Agent, or Firm—Alston & Bird LLP

(57) ABSTRACT

A composite heat sink with high density fins and a method for assembling the composite heat sink are disclosed. The composite heat sink includes a base and a plurality of fins detachably connected to each other, wherein each fin includes a plate and a bottom perpendicularly extended from a first end of the plate. Furthermore, each bottom of the fin is disposed on a surface of the base.

6 Claims, 6 Drawing Sheets

COMPOSITE HEAT SINK WITH HIGH DENSITY FINS AND ASSEMBLING METHOD FOR THE SAME

FIELD OF THE INVENTION

The present invention relates to a composite heat sink and a method for assembling the composite heat sink, and more particularly to a composite heat sink with high density fins and a method for assembling the composite heat sink with high density fins.

BACKGROUND OF THE INVENTION

An integrated circuit chip is widely used in an electrical appliance such as a computer. When the electrical appliance operates, the chip generates energy in the form of heat. If the chip is unable to transfer enough heat to ambient air, the elevated operating temperature may result in damage of the chip or the breakdown of the whole appliance. In order to remove most heat generated from the chip, especially a CPU (central processing unit), a heat sink is usually provided and attached on the top surface of the chip. The heat sink is made of a highly thermal conductive material such as aluminum and copper and has a larger surface area than the attached chip for improving heat transfer. Since the surface area has a major influence on the overall heat transfer, the heat sink is generally constructed to have a flat base with a plurality of parallel fins or pin fins extending outwardly therefrom. Furthermore, in order to dissipate more heat, a heat sink with a greater number of fins, which is referred as a high-density fin heat sink, is developed.

Generally, the heat sink is a parallel finned heat sink. The typical process for fabricating heat sinks includes an extrusion process, a gang sawing process and a bonding process. It is known that the thickness and number of fins produced by the extrusion process are restricted by the structural limitation and stress loading limitation of a die. If the number of fins increases, the die fingers become weaker and thus easily break off. Therefore, the extrusion process is not suitable for fabricating the high-density fin heat sink. The gang sawing process is performed by cutting off portions of a metal block to produce fins having predetermined thickness, number, depth and gap, which results in a great loss of material. In the bonding process, each fin is individually bonded into a base of a heat sink, which is time-consuming and labor intensive. In addition, the fins which are not well-bonded into the base are likely to fall and thus be detached from the base.

Therefore, the present invention provides an improved process for fabricating a heat sink with high-density fins for overcoming the problems described above.

SUMMARY OF THE INVENTION

It is therefore an object of the present invention to provide a composite heat sink with high density fins for easily optionally designing the interval of the fins, the thickness and the height of the composite heat sink.

It is therefore another object of the present invention to provide composite heat sink with high density fins for flexibly changing the number of fin and the interval between the fins to achieve the high density fins in the composite heat sink.

It is therefore an additional object of the present invention to provide a composite heat sink with high density fins and a method for assembling the composite heat sink for reducing the production cost, assembling time, and labor intensive.

It is therefore an additional object of the present invention to provide a composite heat sink with high density fins and a method for assembling the composite heat sink for increasing the strength of the composite heat sink to further improving the supporting effect.

It is therefore an additional object of the present invention to provide a composite heat sink with high density fins and a method for assembling the composite heat sink for avoiding the material waste.

According to an aspect of the present invention, there is provided a composite heat sink with high density fins. The composite heat sink includes a base and a plurality of fins detachably connected to each other, wherein each fin includes a plate and a bottom perpendicularly extended from a first end of the plate. Furthermore, each bottom of the fin is disposed on a surface of the base.

Preferably, each bottom of the fin includes first slots respectively disposed at two ends of the bottom and first buckling elements outwardly expended from the first slots and disposed at a relative position of the first slots. The first buckling element preferably includes two upward protruding pieces.

Preferably, each fin includes two connecting elements perpendicularly expended from a second end of the plate, respectively. Each connecting element preferably includes a second slot and a second buckling element disposed at opposite position of the first slot and the first buckling element, respectively. Preferably, the first buckling element includes two downward protruding pieces.

For example, an additional fan can be further placed on the top of the composite heat sink.

Preferably, the base and the fins are made of metal.

According to another aspect of the present invention, there is provided a composite heat sink with high density fins. The composite heat sink includes a base, and a plurality of fins detachably connected to each other, each fin includes a plate, a bottom perpendicularly extended from a first end of the plate, and two connecting elements perpendicularly expended from a second end of the plate, respectively. Each bottom of the fin includes first slots which are respectively disposed at two ends of the bottom and first buckling elements which are outwardly expended from the first slots and disposed at a relative position of the first slots, wherein each first buckling element includes two upward protruding pieces. Each connecting element includes a second slot and a second buckling element disposed at opposite position of the first slot and the first buckling element, respectively, wherein each second buckling element includes two downward protruding pieces. Each bottom of the fin is disposed on a surface of the base.

According to an additional aspect of the present invention, there is provided a method for assembling a composite heat sink with high density fins. The method includes the steps of (a) providing a plurality of fins including a first fin, a second fin, and a third fin, each fin includes a plate, a bottom perpendicularly extended from a first end of the plate, and two connecting elements perpendicularly expended from a second end of the plate, respectively, wherein each the bottom of the fin includes first slots which are respectively disposed at two ends of the bottom and first buckling elements which are outwardly expended from the first slots and disposed at a relative position of the first slots, and each connecting element includes a second slot and a second buckling element disposed at opposite position of the first slot and the first buckling element, respectively, (b) inserting the first and second buckling elements of the first fin into the first and second slots of the second fin, respectively, and inserting the first and second buckling elements of the second fin into the first and second slots of the third fin, respectively, wherein the bottoms of plural fins which are connected to each other form a continuous plane, and (c) connecting and fixing the continuous plane on a surface of the base.

Preferably, the first buckling element includes two upward protruding pieces.

Preferably, the second buckling element includes two downward protruding pieces.

For example, an additional fan cab be further placed on the top of the composite heat sink.

According to an additional aspect of the present invention, there is provided a method for assembling a composite heat sink with high density fins. The method includes the steps of (a) providing a plurality of fins including a first fin, a second fin, and a third fin, each fin includes a plate, a bottom perpendicularly extended from a first end of the plate, and two connecting elements perpendicularly expended from a second end of the plate, respectively, wherein each bottom of the fin includes first slots which are respectively disposed at two ends of the bottom and first buckling elements which are outwardly expended from the first slots and disposed at a relative position of the first slots, and each connecting element includes a second slot and a second buckling element disposed at opposite position of the first slot and the first buckling element, respectively, (b) inserting the first and second buckling elements of the first fin into the first and second slots of the second fin, respectively, and inserting the first and second buckling elements of the second fin into the first and second slots of the third fin, respectively, to form a first composite member and a second composite member, and (c) arranging and fixing the first and second composite members in parallel on a surface of the base with a particular space for accommodating an engaging member.

The present invention may best be understood through the following description with reference to the accompanying drawings, in which:

DETAILED DESCRIPTION OF THE PREFERRED EMBODIMENTS

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
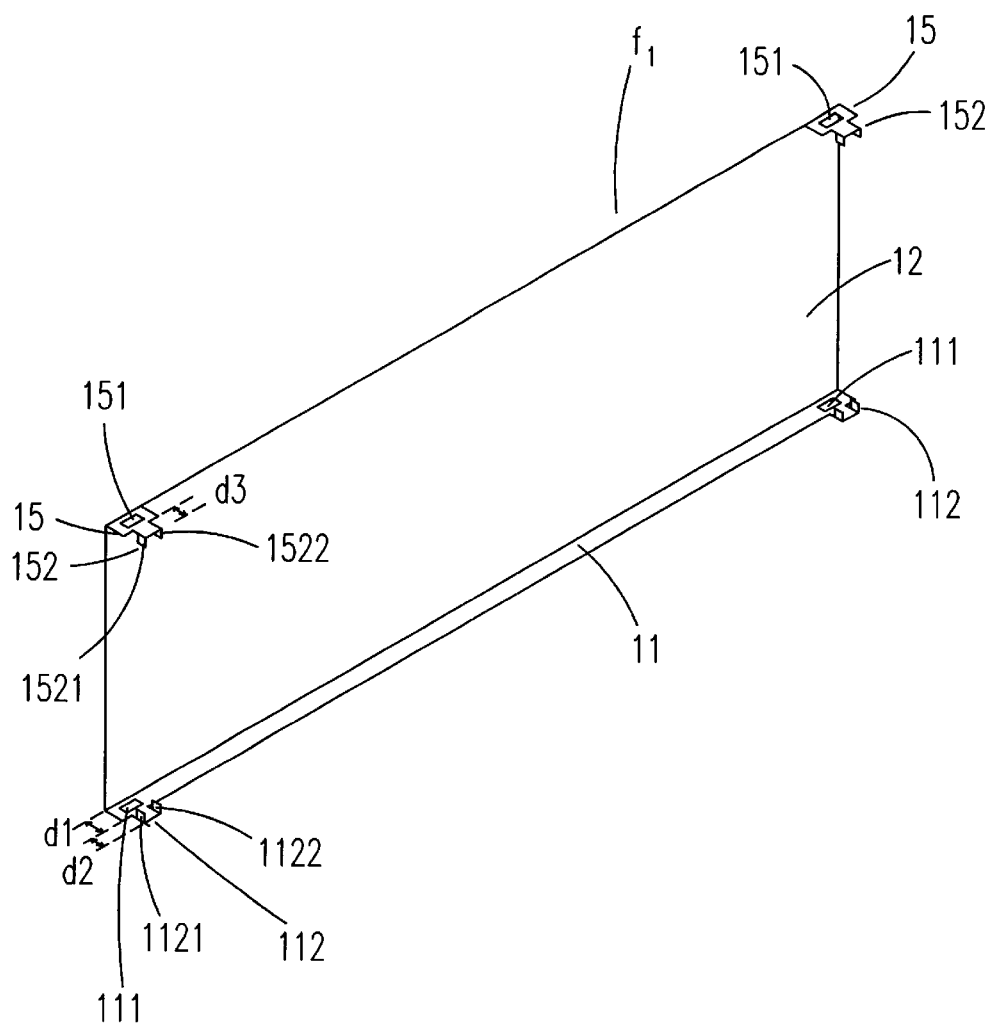
FIG. 1 is a three-dimensional view illustrating a preferred embodiment of a fin of a heat sink according to the present invention.

FIG. 1 is a three-dimensional view illustrating a preferred embodiment of a fin of a heat sink according to the present invention. As shown in FIG. 1, the fin f1 includes a plate 12 and a bottom 11 perpendicularly extended from a first end of the plate 12. The bottom 11 has two first slots 111 disposed at two end of thereof, respectively. Each slot 111 includes a first buckling element 112 outwardly expended therefrom as shown in FIG. 1. Furthermore, each first buckling element 112 further includes two upward protruding pieces 1121 and 1122. In addition, two connecting elements 15 perpendicularly extended from a second end of the plate 12 are disposed close to two corners of the second end of the plates 12, respectively, as shown in FIG. 1. Each connecting element 15 includes a second slot 151 and a second buckling element 152 disposed at opposite positions of the first slot 111 and the first buckling element 112, respectively. Furthermore, each second buckling element 152 includes two downward protruding pieces 1521 and 1522. In addition, the horizontal distances of the bottom 11, the first buckling element and the second buckling element d1, d2 and d3 are almost equal.

Figure 2A:
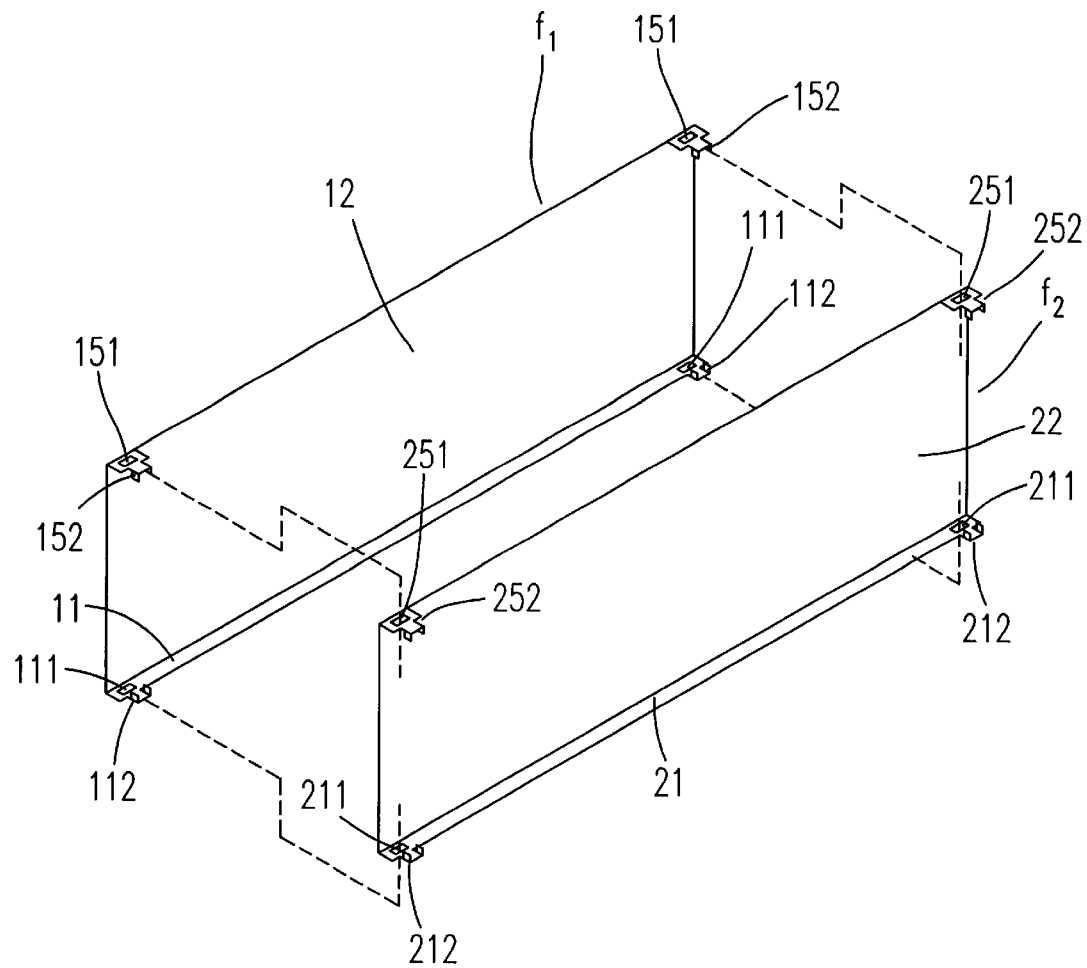
FIGS. 2A–2B are diagrams illustrating how to assemble two fins in FIG. 1 to each other and a three-dimensional view of the two assembled fins.
Figure 2B:
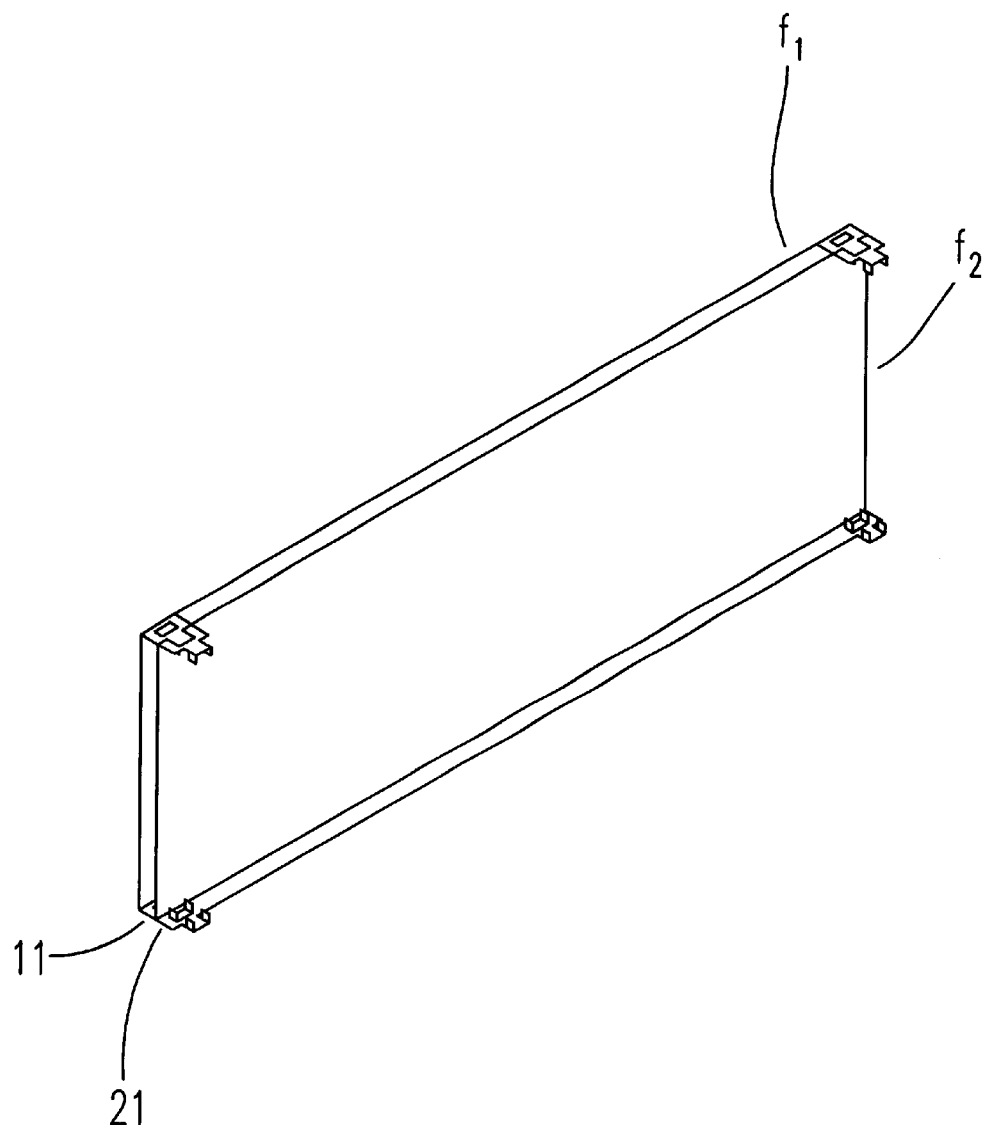
Figure 2C:
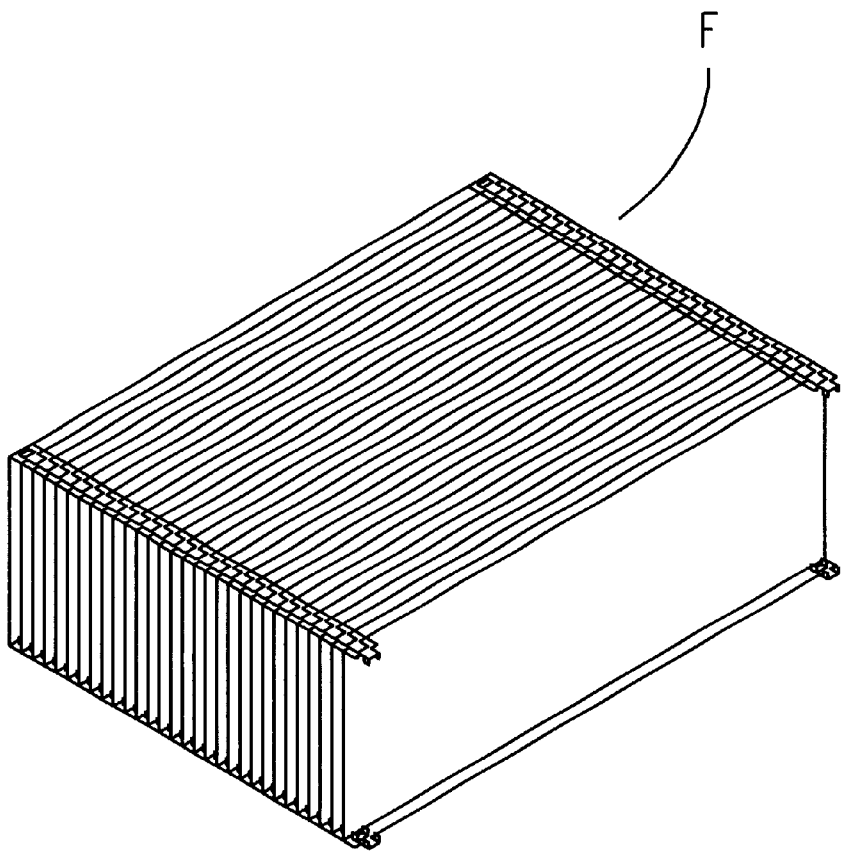
FIG. 2C is a three-dimensional view illustrating a preferred embodiment of a composite fin unit of a heat sink according to the present invention.

FIGS. 2A–2B are diagrams illustrating how to assemble two fins in FIG. 1 to each other and a three-dimensional view of the two assembled fins. As shown in FIG. 2A, the first and second buckling elements 112 and 152 of the fin f1 are inserted into a first and second slots 211 and 251 of another fin f2, respectively. Owing the special elasticity of the metal material such as copper and aluminum, the fins f1 and f2 can engage with each other. Moreover, when the fins f1 and f2 are engaged, the horizontal distance between two fins f1 and f2 is around equal to the horizontal distance of the bottom d1. Thus, after engaging the fin f1 with the fin f2, the bottoms 11 and 21 will form a continuous surface as shown in FIG. 2B. Hence, repeating the assembling procedure of the fins as shown in FIG. 2A, a composite fin unit F is finished as shown in FIG. 2C.

Figure 3:
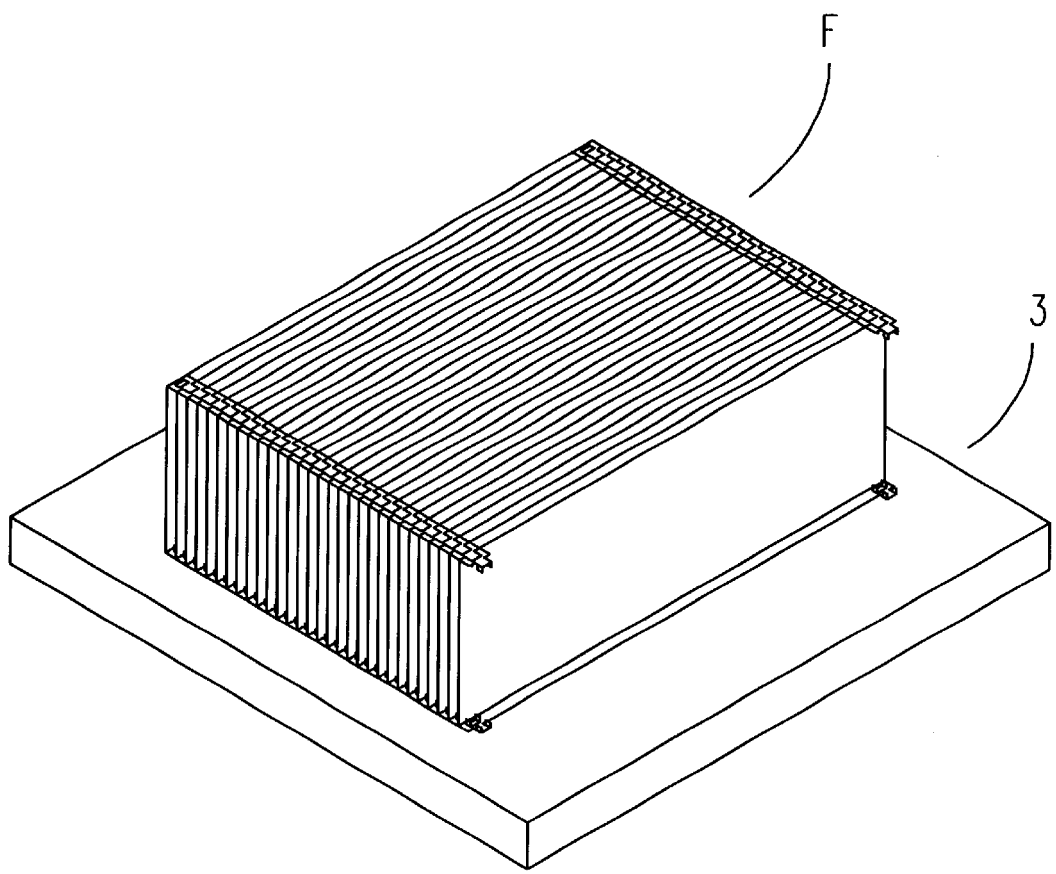
FIG. 3 is a three-dimensional view illustrating a preferred embodiment of a composite heat sink with high density fins according to the present invention.

Please refer to FIG. 3, the continuous surface of the composite fin unit F is adhered on a metal base 3 to form a preferred embodiment of a composite heat sink with high density fins of the present invention.

Figure 4:
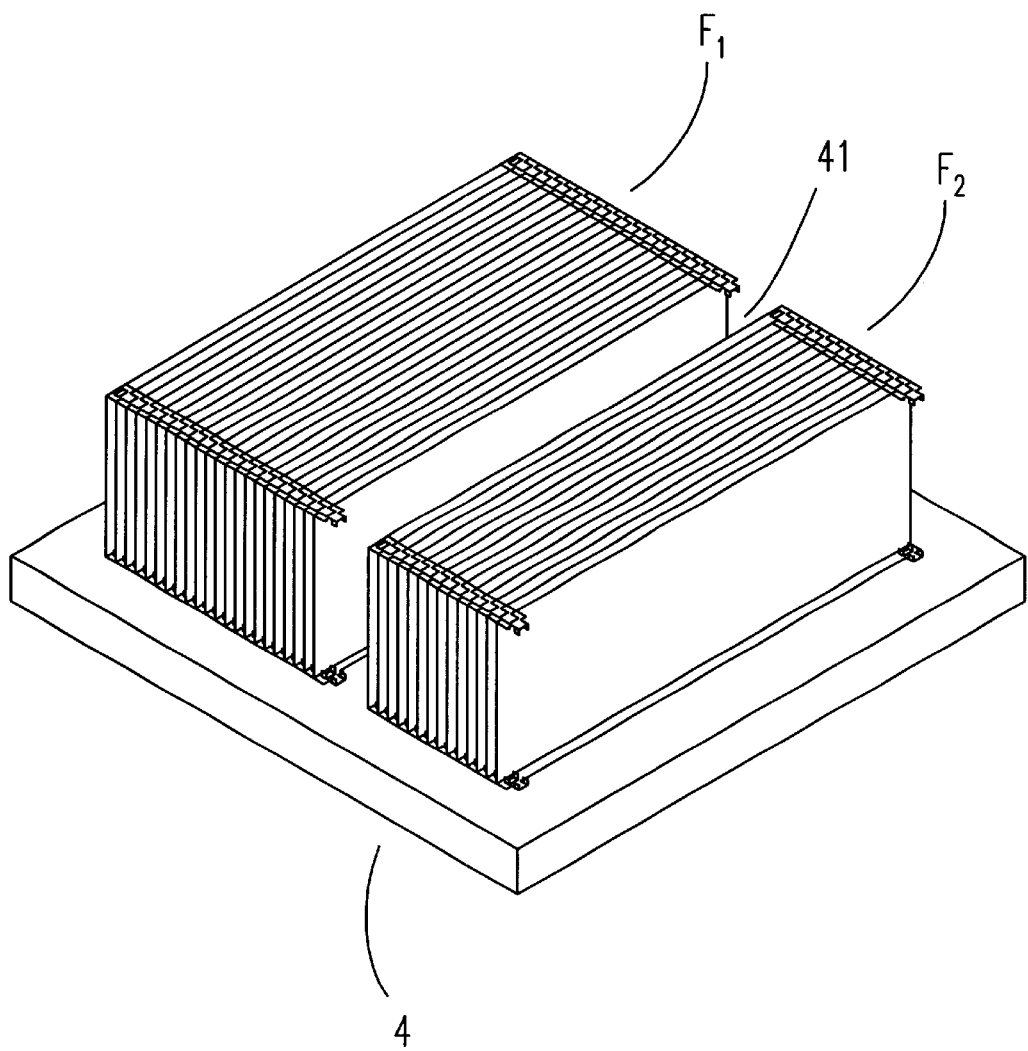
FIG. 4 is a three-dimensional view illustrating another preferred embodiment of a composite heat sink with high density fins according to the present invention.

FIG. 4 is a three-dimensional view illustrating another preferred embodiment of a composite heat sink with high density fins according to the present invention. The assembling method and the structure of the composite heat sink are similar to the aforementioned embodiment. As shown in FIG. 4, two composite fin units F1 and F2 have different number of fins. When the composite fin units F1 and F2 are adhered on a base 4, respectively, as shown in FIG. 4. There is a space 41 between these two composite fin units F1 and F2 for receiving a engaging member (not shown).

The bottom surface of the base in the composite heat sink with high density fins according to the present invention is disposed on a chip and contacted to the surface of the chip for conducting heat from the chip to the fins. In addition, a fan (not shown) can be further disposed on the top of the composite heat sink for dissipating heat into the ambient air by enforced convection.

Therefore, the composite heat sink with high density fins and the method for assembling the composite heat sink have the following advantages:

1. The interval between fins, the thickness and the height of the composite heat sink of the present invention can be pre-set via deciding the horizontal distance of the bottom, the thickness of the plate and the height of the plate in the fin, respectively. Thus, the quality of the composite heat sink is easily controlled.

2. The number of the fins in the composite heat sink is dependent on the practical requirement. Thus, it is really flexible for the assembly of the composite heat sink.

3. Comparing with the typical bonding process that the slot on the base depended on the number of the fins has to be pre-formed for adhering the fins thereon, the present invention only requires a flat surface of the base. Thus, the production cost can be reduced.

4. In the typical bonding process, each fin is individually bonded into a base of a heat sink, which is time-consuming and labor intensive. Therefore, the present invention can save assembling time and labor.

5. The supporting effect of the heat sink according to the typical bonding process is not good because the supporting effect only comes from the bottom of the heat sink. On the other hand, the fins in the composite heat sink of the present invention are engaged with one another, so the composite heat sink has a strong structure and further has very good supporting effect.

6. The present invention can avoiding the die finger broken problem of the extrusion process and the material waste problem of the gang sawing process.

In sum, the present invention provides the composite heat sink with high density fins and the method for assembling the composite heat sink for having the convenience, the flexibility, and the good positioning and supporting effects. In addition, the material cost, assembling time, and labor intensive can be reduced.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A composite heat sink comprising:
   a base; and
   a plurality of fins detachably connected to each other, each said fin includes a plate, a bottom perpendicularly extended from a first end of said plate, and two connecting elements perpendicularly expended from a second end of said plate, respectively, wherein each said bottom of said fin includes first slots which are respectively disposed at two ends of said bottom and first buckling elements which are outwardly expended from said first slots and disposed at a relative position of said first slots, wherein each said first buckling element includes two upward protruding pieces, and each said connecting element includes a second slot and a second buckling element disposed at opposite position of said first slot and said first buckling element, respectively, wherein each said second buckling element includes two downward protruding pieces,
   wherein:
   each said bottom of said fin is disposed on a surface of said base.

2. A method for assembling a composite heat sink, comprising the steps of:
   (a) providing a plurality of fins including a first fin, a second fin, and a third fin, each said fin includes a plate, a bottom perpendicularly extended from a first end of said plate, and two connecting elements perpendicularly expended from a second end of said plate, respectively, wherein each said bottom of said fin includes first slots which are respectively disposed at two ends of said bottom and first buckling elements which are outwardly expended from said first slots and disposed at a relative position of said first slots, wherein each said first buckling element includes two upward protruding pieces, and each said connecting element includes a second slot and a second buckling element disposed at opposite position of said first slot and said first buckling element, respectively, wherein each said second buckling element includes two downward protruding pieces;
   (b) inserting said first and second buckling elements of said first fin into said first and second slots of said second fin, respectively, and inserting said first and second buckling elements of said second fin into said first and second slots of said third fin, respectively, wherein said bottoms of plural fins which are connected to each other form a continuous plane; and
   (c) connecting and fixing said continuous plane on a surface of said base.

3. The composite heat sink according to claim 2 wherein an additional fan is further placed on a top of said composite heat sink.

4. A method for assembling a composite heat sink, comprising the steps of:
   (a) providing a plurality of fins including a first fin, a second fin, and a third fin, each said fin includes a plate, a bottom perpendicularly extended from a first end of said plate, and two connecting elements perpendicularly expended from a second end of said plate, respectively, wherein each said bottom of said fin includes first slots which are respectively disposed at two ends of said bottom and first buckling elements which are outwardly expended from said first slots and disposed at a relative position of said first slots, wherein each said first buckling element includes two upward protruding pieces, and each said connecting element includes a second slot and a second buckling element disposed at opposite position of said first slot and said first buckling element, respectively, wherein each said second buckling element includes two downward protruding pieces;
   (b) inserting said first and second buckling elements of said first fin into said first and second slots of said second fin, respectively, and inserting said first and second buckling elements of said second fin into said first and second slots of said third fin, respectively, to form a first composite member and a second composite member; and
   (c) arranging and fixing said first and second composite members in parallel on a surface of said base with a particular space for accommodating an engaging member.

5. The composite heat sink according to claim 1 wherein an additional fan is further placed on a top of said composite heat sink.

6. The composite heat sink according to claim 1 wherein said base and said fins are made of metal.

* * * * *